(12) United States Patent
Herrmann et al.

(10) Patent No.: US 7,316,938 B2
(45) Date of Patent: Jan. 8, 2008

(54) ADJUSTABLE FILM FRAME ALIGNER

(75) Inventors: Steve Herrmann, Chaska, MN (US); Willard Charles Raymond, Plymouth, MN (US); Matthew LaBerge, Blaine, MN (US)

(73) Assignee: Rudolph Technologies, Inc., Flanders, NJ (US)

( * ) Notice: Subject to any disclaimer, the term of this patent is extended or adjusted under 35 U.S.C. 154(b) by 310 days.

(21) Appl. No.: 10/891,278

(22) Filed: Jul. 14, 2004

(65) Prior Publication Data
US 2005/0012229 A1 Jan. 20, 2005

Related U.S. Application Data

(60) Provisional application No. 60/487,151, filed on Jul. 14, 2003.

(51) Int. Cl.
*H01L 21/44* (2006.01)
(52) U.S. Cl. ............... 438/106; 356/139.04; 356/400; 125/13.01; 348/126
(58) Field of Classification Search ............... 438/106; 356/139.04, 400; 125/13.01; 348/126
See application file for complete search history.

(56) References Cited

U.S. PATENT DOCUMENTS

| 4,328,553 A | 5/1982 | Fredriksen et al. |
|---|---|---|
| 4,464,705 A | 8/1984 | Horowitz |
| 4,644,172 A | 2/1987 | Sandland et al. |
| 4,823,394 A | 4/1989 | Berkin et al. |
| 5,091,963 A | 2/1992 | Litt et al. |
| 5,497,381 A | 3/1996 | O'Donoghue et al. |
| 5,592,295 A | 1/1997 | Stanton et al. |
| 5,640,200 A | 6/1997 | Michael |
| 5,641,960 A | 6/1997 | Okubo et al. |
| 5,787,190 A | 7/1998 | Peng et al. |
| 5,822,055 A | 10/1998 | Tsai et al. |
| 5,850,466 A | 12/1998 | Schott |
| 5,856,844 A | 1/1999 | Battermann et al. |
| 5,917,588 A | 6/1999 | Addiego |
| 5,949,901 A | 9/1999 | Nichani et al. |
| 6,137,303 A | 10/2000 | Deckert et al. |
| 6,140,254 A | 10/2000 | Endisch et al. |
| 6,147,357 A | 11/2000 | Nicolescu |
| 6,153,361 A | 11/2000 | Liu et al. |
| 6,314,379 B1 | 11/2001 | Hu et al. |
| 6,324,298 B1 | 11/2001 | O'Dell et al. |
| 6,412,326 B1 | 7/2002 | Hubbard et al. |
| 6,565,920 B1 | 5/2003 | Endisch |
| 6,640,151 B1 | 10/2003 | Somekh et al. |
| 6,708,074 B1 | 3/2004 | Chi et al. |
| 2003/0030050 A1 | 2/2003 | Choi |
| 2003/0202178 A1 | 10/2003 | Tsuji et al. |

*Primary Examiner*—Long Pham
(74) *Attorney, Agent, or Firm*—Dicke, Billig & Czaja, PLLC

(57) ABSTRACT

A film frame aligner for automatically aligning a film frame includes a film frame support, a film frame pusher for pushing the film frame, and a film frame location mechanism for locating at least one notch in the film frame.

24 Claims, 5 Drawing Sheets

ADJUSTABLE FILM FRAME ALIGNER

CROSS-REFERENCE TO RELATED APPLICATIONS

This application claims the benefit of U.S. Provisional Application Ser. No. 60/487,151, filed on Jul. 14, 2003, and entitled ADJUSTABLE FILM FRAME ALIGNER.

BACKGROUND

1. Technical Field

The present invention relates to film frames as used in semiconductor and microelectronics manufacturing, and more specifically a device for ensuring the proper concentricity and square-ness of a film frame in relation to the process used to optically inspect the product on the film frame.

2. Background Information

Over the past several decades, the semiconductor has exponentially grown in use and popularity. The semiconductor has in effect revolutionized society by introducing computers, electronic advances, and generally revolutionizing many previously difficult, expensive and/or time consuming mechanical processes into simplistic and quick electronic processes. This boom in semiconductors has been fueled by an insatiable desire by business and individuals for computers and electronics, and more particularly, faster, more advanced computers and electronics whether it be on an assembly line, on test equipment in a lab, on the personal computer at one's desk, or in the home electronics and toys.

The manufacturers of semiconductors have made vast improvements in end product quality, speed and performance as well as in manufacturing process quality, speed and performance. However, there continues to be demand for faster, more reliable and higher performing semiconductors.

Processors who are building semiconductors and like microelectronics must handle the substrate that holds the semiconductor or like microelectronics. This handling process often involves the need to align, and more specifically, as to film frames, a film frame aligner is needed to ensure the proper concentricity and square-ness of a film frame in relation to the process used to optically inspect the product on the film frame. It is known that the act of aligning the film frame speeds up the optical inspection process and ultimately leads to less time to inspect, and thus it is desirable to perform film frame alignment and more importantly to improve upon the current systems and process. It is also known that aligning the film frames ensures that they will insert smoothly back into the film frame cassette preventing a damaging collision.

SUMMARY

One form of the present invention provides a film frame aligner for automatically aligning a film frame. The film frame aligner includes a film frame support, a film frame pusher for pushing the film frame, and a film frame location mechanism for locating at least one notch in the film frame.

BRIEF DESCRIPTION OF THE DRAWINGS

Preferred embodiment of the invention, illustrative of the best mode in which applicant has contemplated applying the principles, are set forth in the following description and are shown in the drawings and are particularly and distinctly pointed out and set forth in the appended claims.

Similar numerals refer to similar parts throughout the drawings.

DETAILED DESCRIPTION

Figure 1:
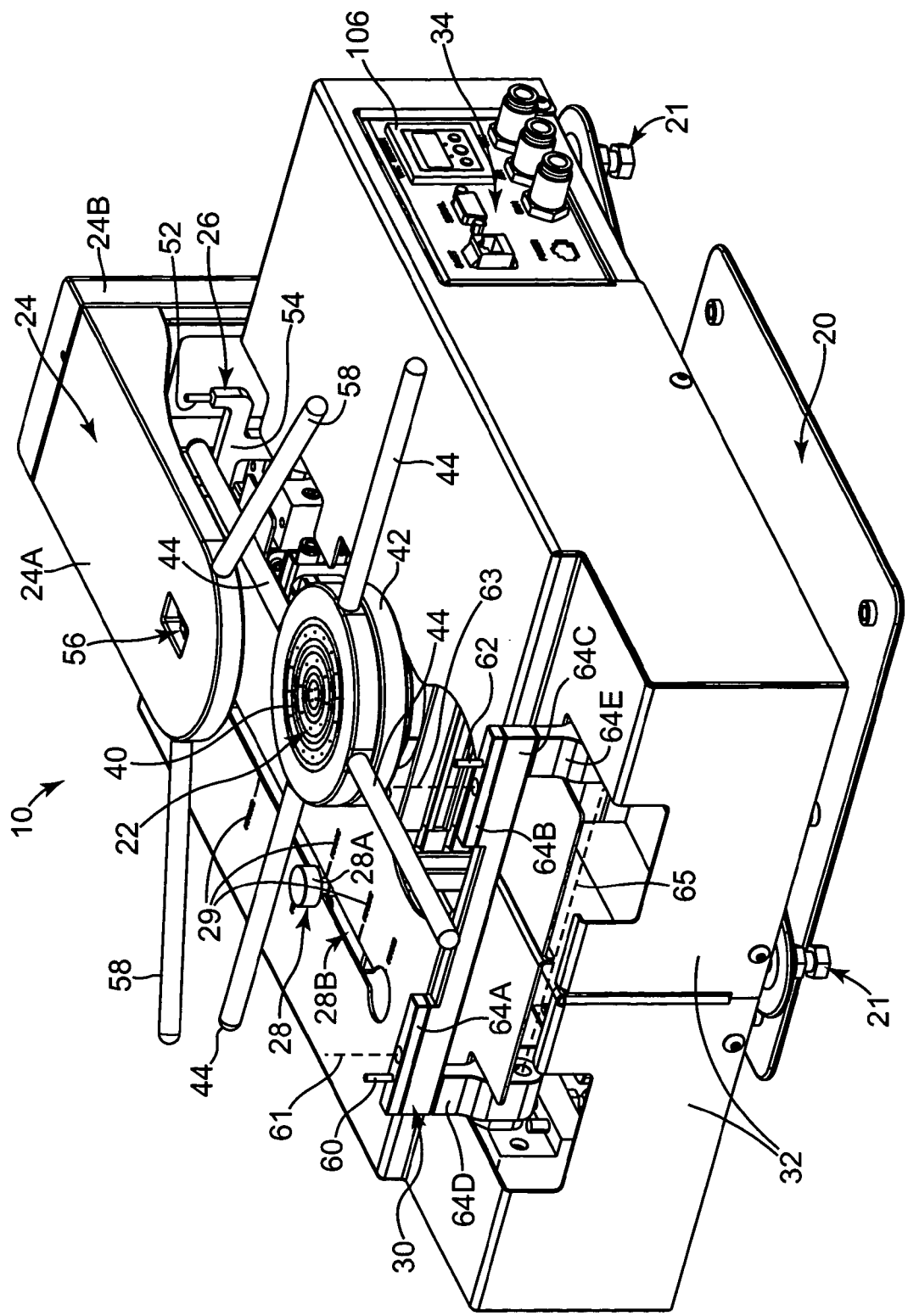
FIG. 1 is a perspective view of one embodiment of the film frame aligner.

The film frame aligner of the present invention is indicated generally at 10 in the Figures and is used in one environment to align film frames. The film frame aligner 10 in a first embodiment as is shown in the Figures, includes an aligner pedestal 20, a film frame support 22, a film frame wait station 24, a film frame pusher 26, an adjustment mechanism 28, a film frame location mechanism 30, a cover 32, and a control panel 34. The film frame aligner 10 according to one embodiment is a stand alone, automated device that is used to automatically align a film frame.

FIG. 1 is a perspective view of one embodiment of the film frame aligner 10. The aligner pedestal 20 is a base with leveling capabilities. In the embodiment shown, the aligner pedestal 20 provides three point leveling, although other leveling techniques are contemplated. Two of the three point levelers 21 are visible in FIG. 1.

The film frame support 22 includes a vacuum chuck 40 on a rotation mechanism 42. In a preferred embodiment, the rotation mechanism 42 is a rotary cylinder with a vacuum chuck face in its face that is coated with an anti-stick coating and surrounded by a plurality of optional support arms 44. In the version shown, four support arms 44 or specially designed rods are present to support a film frame. One or more of the support arms 44 are removable to support different film frame sizes, and in one embodiment, are replaceable by support arms 44 having a different length. In one embodiment, the film frame support 22 also includes a product placement detector 46 (shown in FIG. 7), which in the preferred embodiment includes a vacuum sensor 106.

Wait station 24 includes a vertical support 24B and a base 24A. The vertical support 24B extends up vertically from one end of the aligner 10. The base 24A is attached to the vertical support 24B and extends horizontally from the vertical support 24B. The base 24A is positioned above the vacuum chuck 40, and partially overlaps the vacuum chuck 40 when viewed from above, as can be best seen in FIG. 5. In one embodiment, the film frame wait station 24 includes a product placement detector 56. In one form of the invention, the film frame wait station also includes a plurality of support arms 58 extending outward from the base 24A. In the embodiment shown, two support arms 58 or specially designed rods are present to support a film frame.

The film frame pusher 26 is a device for pushing a film frame placed on film frame support 22. In the embodiment shown, the film frame pusher 26 includes one or more pins, and in the preferred embodiment includes a pair of pusher pins 50 and 52 on a pin holder 54 (pin 50 is not visible in FIG. 1, but is visible in FIGS. 3 and 4). In the embodiment shown, the pin holder 54 is a field goal post shaped device, although it may be of other configurations so long as the one or more pins 50 and 52 are positioned thereon, extending therefrom and movable both to push a film frame laterally in relation to the vacuum surface of the vacuum chuck 40 as well as move up and down. Pin holder 54 is configured to rotate about an axis (not visible in FIG. 1) that is parallel to axis 65 of location mechanism 30, and thereby cause pins 50 and 52 to raise and lower. The axis of rotation of pin holder 54 is parallel to the vacuum surface of the chuck 40 and perpendicular to the direction of movement of the film frame as it is pushed by the pusher 26.

The adjustment mechanism 28 includes an adjustment knob 28A, and a track 28B formed in a top surface of the film frame aligner 10. The track 28B includes a plurality of selectable positions 29. In one embodiment, the adjustment mechanism 28 is used to manually select a film frame size of a film frame to be aligned. In one form of the invention, the adjustment mechanism 28 includes six selectable positions 29, with each of the selectable positions 29 corresponding to a particular film frame size. In another embodiment, the adjustment mechanism 28 includes three selectable positions 29, with each of the selectable positions corresponding to a particular film frame size. In one embodiment, the selectable positions 29 include a first position corresponding to 150 millimeter film frames, a second position corresponding to 200 millimeter film frames, and a third position corresponding to 300 millimeter film frames. In one form of the invention, one of the selectable positions 29 is chosen by an operator by lifting knob 28A upward, sliding the knob 28A along the track 28B to the desired position 29, and then releasing the knob 28A. Sliding knob 28A along the track 28B causes film frame support 22 to be moved in the same direction as the knob 28A, and configure the film frame aligner 10 for the selected film frame size. Adjustment mechanism 28 according to one embodiment provides the ability to easily configure the film frame aligner 10 for different film frame sizes using a single knob 28A, and without using any tools.

The film frame location mechanism 30 is a device for locating a film frame placed on film frame support 22. In the embodiment shown, the film frame location mechanism 30 includes one or more pins, and in the preferred embodiment includes a pair of locator pins 60 and 62 on locator bars or blocks 64A and 64B, respectively. In the embodiment shown, the locator blocks 64A and 64B are elongated bars, although they may be of other configurations so long as the one or more pins 60 and 62 are positioned thereon, extending therefrom and pivotal about central pivots or axes 61 and 63 such that the locator blocks 64A and 64B swivel. This swivel action or rotation about central pivots 61 and 63 allows the adjustment of the pins 60 and 62 to meet the different film frame sizes. In addition, ball detents are used in one embodiment to keep the locator block 64A and 64B from swiveling freely. The axes 61 and 63 are perpendicular to the vacuum surface of the chuck 40.

The film frame location mechanism 30 also includes an elongated block 64C connected to the two locator blocks 64A and 64B, and connected to support arms 64D and 64E.

Support arms 64D and 64E are configured to rotate about axis 65, and thereby cause pins 60 and 62 to raise and lower. Axis 65 is parallel to the vacuum surface of the chuck 40 and perpendicular to the direction of movement of the film frame as it is pushed by the pusher 26.

Figure 2:
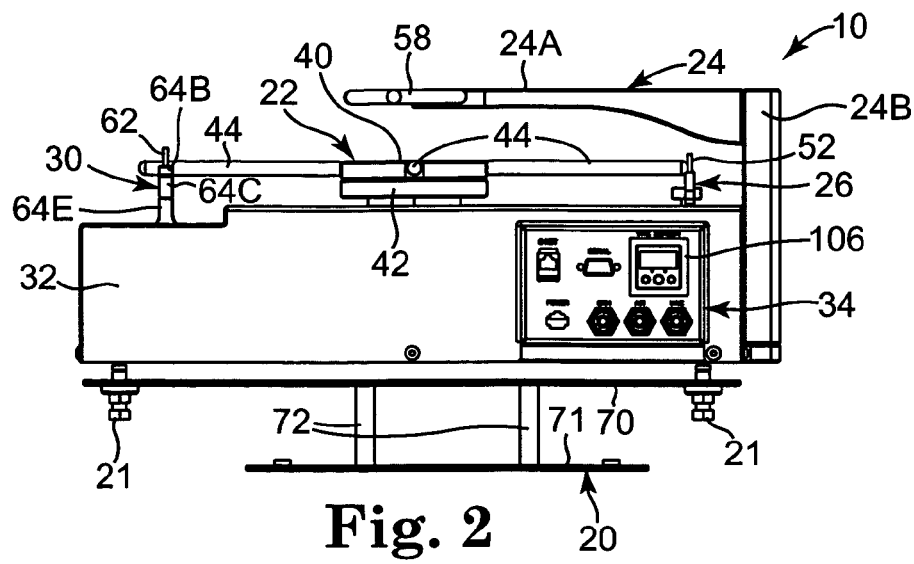
FIG. 2 is a first side view of the film frame aligner of FIG. 1 according to one embodiment of the present invention.
Figure 3:
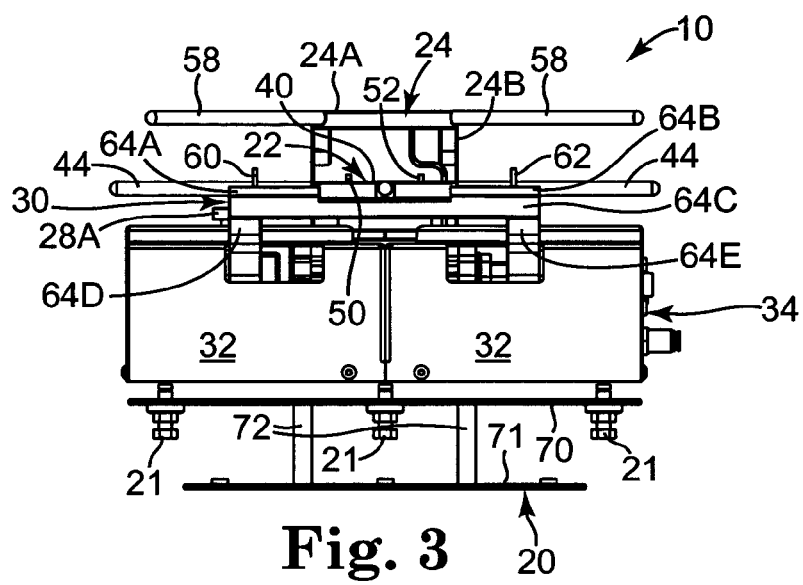
FIG. 3 is a front view of the film frame aligner of FIG. 1 according to one embodiment of the present invention.
Figure 4:
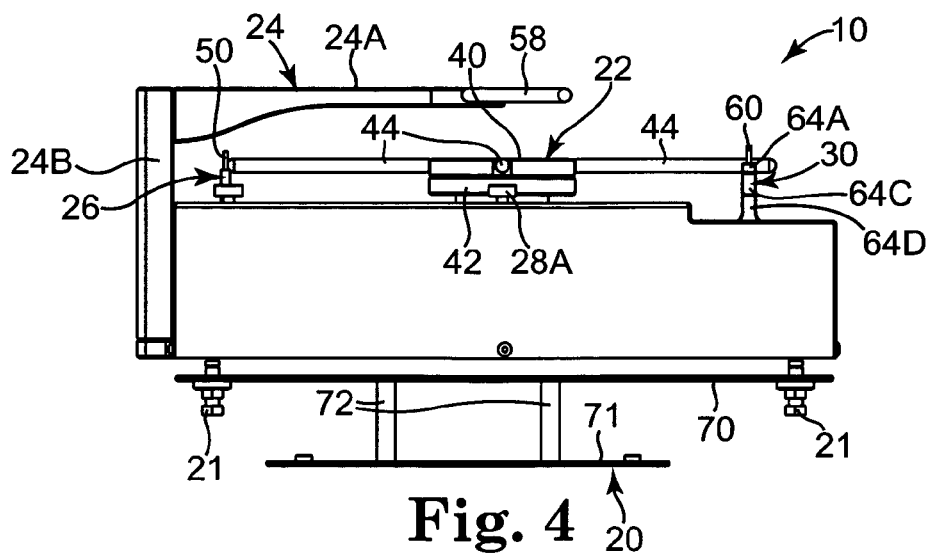
FIG. 4 is a second side view of the film frame aligner of FIG. 1 according to one embodiment of the present invention.

FIG. 2 is a first side view of the film frame aligner 10 of FIG. 1 according to one embodiment of the present invention. FIG. 3 is a front view of the film frame aligner 10 of FIG. 1 according to one embodiment of the present invention. FIG. 4 is a second side view of the film frame aligner 10 of FIG. 1 according to one embodiment of the present invention. As can be seen in FIGS. 2-4, the aligner pedestal 20 includes a top base 70 and a bottom base 71, which are connected together by a plurality of columns 72. Top base 70 is attached to a bottom surface of the film frame aligner via a plurality of point levelers 21. Bottom base 71 is configured to be attached to a mounting surface. Point levelers 21 are manually adjustable to raise or lower the film frame aligner 10 at their corresponding points of contact with the bottom surface of the film frame aligner 10.

Figure 5:
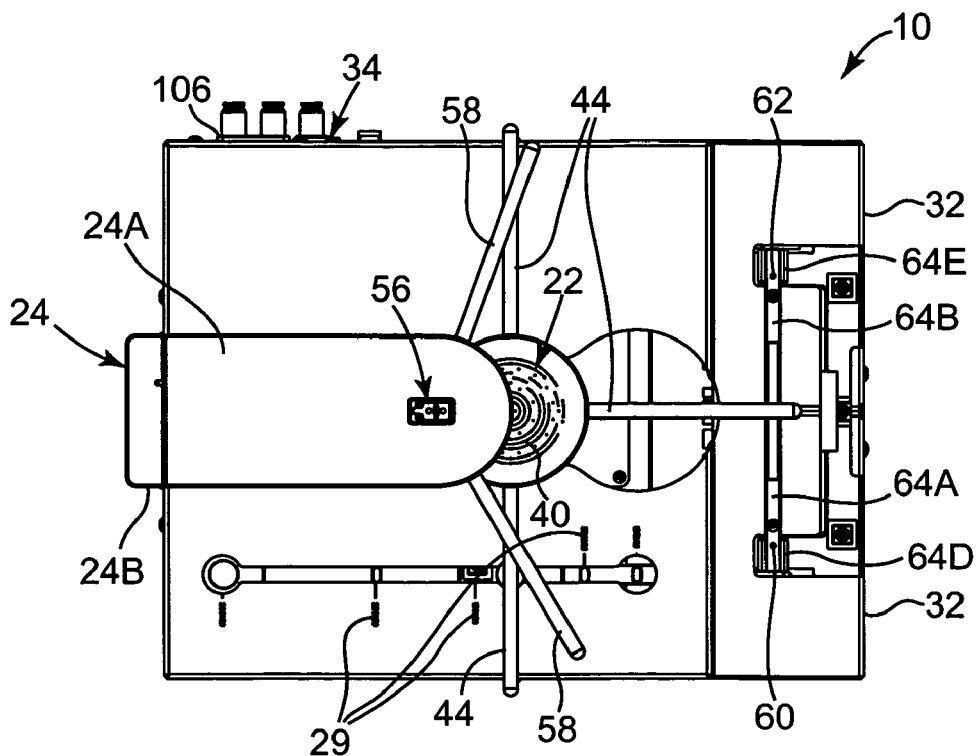
FIG. 5 is a top view of the film frame aligner of FIG. 1 according to one embodiment of the present invention.

FIG. 5 is a top view of the film frame aligner 10 of FIG. 1 according to one embodiment of the present invention. As can be seen in FIG. 5, the base 24A of the wait station 24 is positioned above the vacuum chuck 40. In one embodiment, after a film frame is placed on vacuum chuck 40 and then aligned (as described in further detail below), the aligned film frame is removed from vacuum chuck 40 and placed on base 24A of wait station 24.

Figure 6:
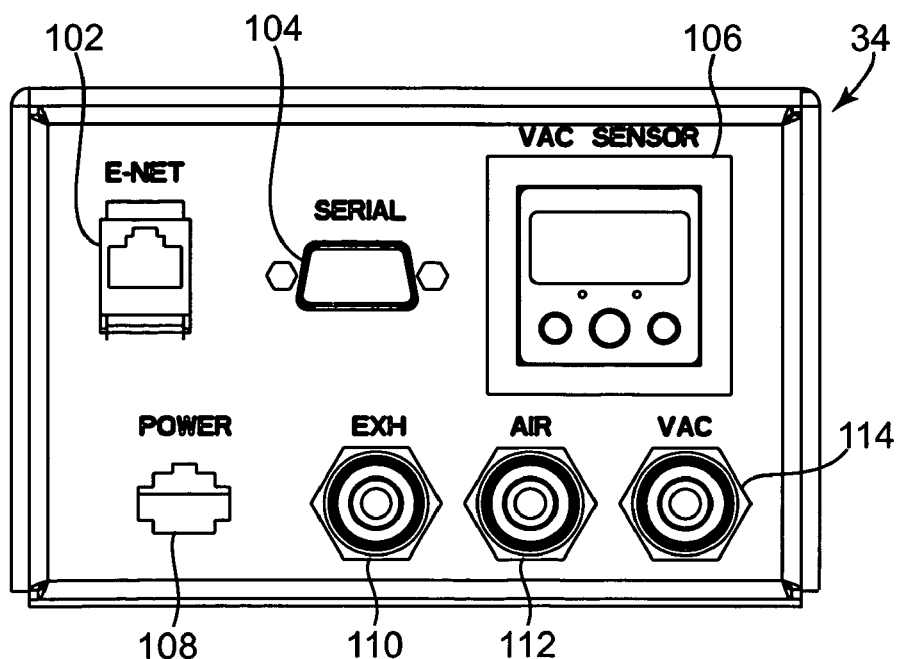
FIG. 6 is an enlarged view of the control panel of the film frame aligner shown in FIG. 2 according to one embodiment of the present invention.

FIG. 6 is an enlarged view of the control panel 34 of the film frame aligner 10 shown in FIG. 2 according to one embodiment of the present invention. The control panel 34 includes Ethernet (E-NET) port 102, serial port 104, vacuum sensor 106, power connector 108, exhaust (EXH) connector 110, air connector 112, and vacuum (VAC) connector 114. Ethernet port 102 is configured to be connected to an Ethernet network so that a computer or other device connected to the network can control the film frame aligner 10 through the network connection. Serial port 104 is connected to a controller 120 (FIG. 7) within film frame aligner 10, and is used in one embodiment to program the controller 120 and upgrade the firmware of the controller 120. Vacuum sensor 106 is connected to vacuum chuck 40 (FIG. 1), and is used in one embodiment to sense whether a film frame is positioned on vacuum chuck 40. Power connector 108 is configured to be connected to a power supply for providing power to film frame aligner 10. In one embodiment, film frame aligner 10 is configured to operate on 24 volts DC. Exhaust connector 110 is configured to be connected to an exhaust line for exhausting air from film frame aligner 10. Air connector 112 is configured to be connected to an air supply line for supplying air to film frame aligner 10. Vacuum connector 114 is configured to be connected to a vacuum supply line for supply a vacuum to film frame aligner 10.

Figure 7:
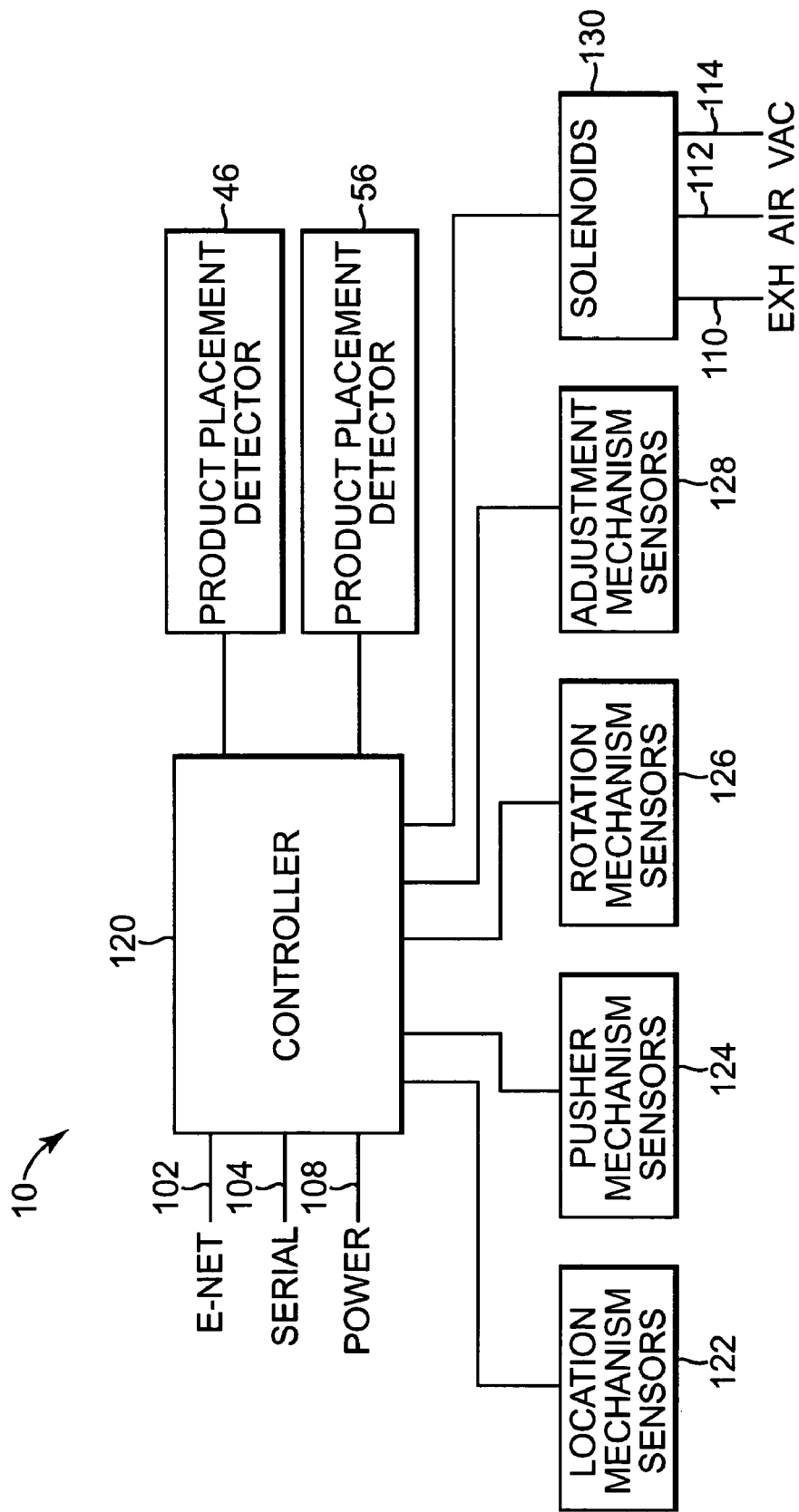
FIG. 7 is a block diagram illustrating components of the film frame aligner of FIG. 1 according to one embodiment of the present invention.

FIG. 7 is a block diagram illustrating components of the film frame aligner 10 of FIG. 1 according to one embodiment of the present invention. Film frame aligner 10 includes a controller 120, which is coupled to product placement detectors 46 and 56, location mechanism sensors 122, pusher mechanism sensors 124, rotation mechanism sensors 126, adjustment mechanism sensors 128, and solenoids 130. As shown in FIG. 7, the ports 102 and 104 and the connector 108 from control panel 34 are connected to controller 120, and the connectors 110, 112, and 114 from control panel 34 are connected to solenoids 130 within film frame aligner 10.

In one embodiment, controller 120 includes a microprocessor and memory, and is configured to control the operation of film frame aligner 10 based on information received from detectors 46 and 46, sensors 122, 124, 126, and 128, and control information received from a control device via Ethernet port 102. Controller 120 is described in further detail below with reference to FIG. 8.

Product placement detector 46 detects when a film frame has been placed on vacuum chuck 40, and outputs a detection signal to controller 120 when a film frame has been detected on vacuum chuck 40. Product placement detector 56 detects when a film frame has been placed on wait station 24, and outputs a detection signal to controller 120 when a film frame has been detected on wait station 24.

Location mechanism sensors 122 sense the position of location mechanism 30, and output signals to controller 120 that indicate the current position of the location mechanism 30. In one embodiment, location mechanism sensors 122 include a first sensor that senses when location mechanism 30 is in a fully down position, and a second sensor that senses when location mechanism 30 is in a fully up position. Pusher mechanism sensors 124 sense the position of pusher mechanism 26, and output signals to controller 120 that indicate the current position of the pusher mechanism 26. In one embodiment, pusher mechanism sensors 124 include a first sensor that senses when pusher mechanism 26 is in a fully down position, and a second sensor that senses when pusher mechanism 26 is in a fully up position.

Rotation mechanism sensors 126 sense the position of vacuum chuck 40, and output signals to controller 120 that indicate the current position of the vacuum chuck 40. Adjustment mechanism sensors 128 sense the position of selection knob 28A, and output signals to controller 120 that indicate the current position of selection knob 28A.

Solenoids 130, according to one embodiment, cause the movement of pusher mechanism 26, location mechanism 30, and vacuum chuck 40, based on control signals received from controller 120. Solenoids 130 are coupled to exhaust connector 110, air connector 112, and vacuum connector 114. Exhaust air from solenoids 130 is exhausted from film frame aligner 10 through exhaust connector 110. Air is supplied to solenoids 130 via air connector 112. A vacuum is supplied to solenoids 130 via vacuum connector 114.

One embodiment of a method for aligning a film frame with film frame aligner 10 is as follows. The main steps according to one embodiment are: (1) placing a film frame on the vacuum chuck 40; (2) trigger film frame location pins 60 and 62 to rise; (3) trigger film frame pusher pins 50 and 52 to rise; (4) trigger film frame pusher pins 50 and 52 to lower; (5) trigger film frame location pins 60 and 62 to lower; (6) rotate film frame if needed; and (7) remove film frame.

Figure 8:
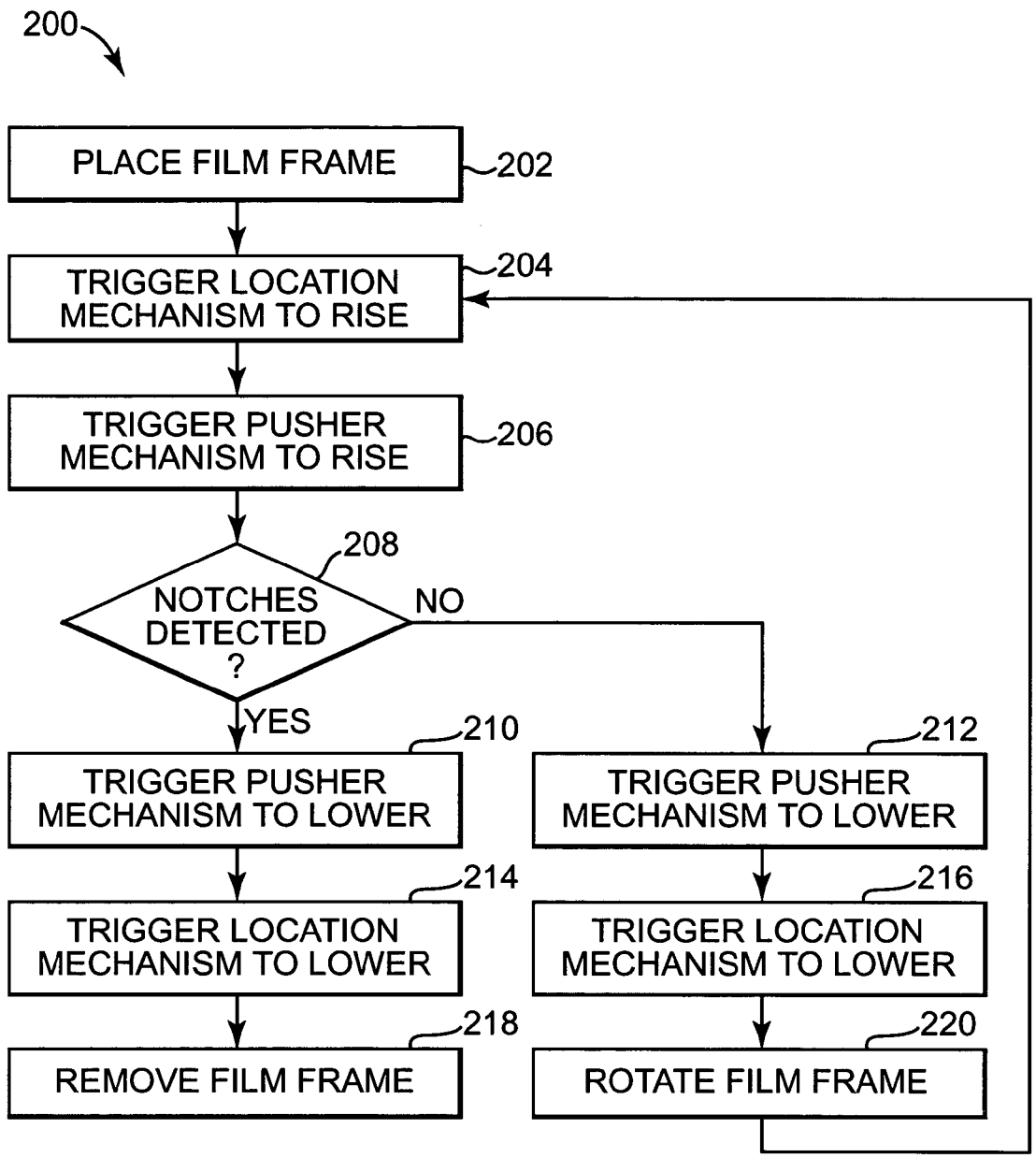
FIG. 8 is a flow diagram illustrating a method for aligning a film frame with the film frame aligner of FIG. 1 according to one embodiment of the present invention.

FIG. 8 is a flow diagram illustrating a method 200 for aligning a film frame with the film frame aligner 10 of FIG. 1 according to one embodiment of the present invention. In step 202, a film frame is placed on vacuum chuck 40. In one embodiment, the placement of the film frame involves some form of a wafer handling arm, robot or other device as is well known in the art, for placing a film frame upon vacuum chuck 40, whereby the vacuum chuck 40 and arms 44 support the film frame. The film frame's placement is detected by product placement detector 46.

In step 204, controller 120 triggers the location mechanism 30 to rise. The film frame location mechanism 30 is actuated by one or more (in this case two) rotary cylinders causing the block 64C to swivel or rotate about axis 65 such that the locator pins 60 and 62 rise. In one embodiment, location mechanism sensors 122 (FIG. 7) are hall effect sensors that ensure that the pins 60 and 62 did not get stuck on their way up, while adjustable flow controls ensure that the pins 60 and 62 do not push or launch the film frame off of the aligner 10.

In step 206, controller 120 triggers the pusher mechanism 26 to rise. Once the film frame location mechanism 30 has located the film frame in step 204, the film frame pusher pins 50 and 52 are actuated by one or more (in this case one) rotary cylinders causing the pin holder 54 to rotate, and the pins 50 and 52 thereon to rise. The pins 50 and 52 contact an edge of the film frame, and push the film frame across the vacuum chuck 40 and into the location pins 60 and 62 to locate the film frame. Film frames have two notches, which are used in one embodiment for locating purposes. In one form of the invention, only one rotary cylinder is used for the pusher mechanism 26 so as to not provide too much power.

In step 208, controller 120 determines whether the notches in the film frame have been detected. In one embodiment, the pusher mechanism sensors 124 (FIG. 7) are hall effect sensors that are used to ensure that the pusher mechanism 26 did not get stuck on the way up, and are also used to detect the notches in a film frame and thereby determine the orientation of the film frame. If a notch detection is made by pusher mechanism sensors 124 upon the pusher mechanism 26 rising, then the notches on the film frame have engaged with the film frame locating pins 60 and 62, and the method 200 moves to step 210. If a notch detection is not made by the pusher mechanism sensors 124 upon the pusher mechanism 26 rising, then the notches on the film frame are in some other orientation, and the method 200 moves to step 212. In one embodiment, the pusher mechanism sensors 124 sense whether the pusher mechanism 26 has reached a fully up position. If the pusher mechanism 26 has reached a fully up position, this indicates that the notches on the film frame have engaged with the location pins 60 and 62 of the location mechanism 30, and a notch detection is made. If the pusher mechanism 26 has not reached a fully up position, this indicates that the notches on the film frame have not engaged with the location pins 60 and 62, and a notch detection is not made.

In step 210, controller 120 triggers the film frame pusher mechanism 26 to lower. In step 214, controller 120 triggers the film frame location mechanism 30 to lower. In the illustrated embodiment of method 200, the pusher mechanism 26 is lowered before the location mechanism 30 so as not to push the film frame too far.

Once the location mechanism 30 is lowered in step 214, the film frame is officially aligned, and in step 218, the film frame is removed from vacuum chuck 40 by a robot or other automated film frame handling device, and, in one embodiment, the removed film frame is then placed in an inspection module. The pushing of the film frame into the location mechanism 30 causes the film frame to be aligned and have the proper concentricity and squareness for the inspection process. Concentricity, according to one embodiment, means that the center of the film frame is positioned such that it will line up with the center of the inspection platform. Squareness, according to one embodiment, means that the film frame is oriented such that it will be square to the X and Y movement of the moving stage of the inspection module. In one form of the invention, if the inspection module is not ready to inspect a new film frame, the aligned film frame is removed from vacuum chuck 40 by the film frame handling device and placed on wait station 24. The film frame wait station 24 is used in one embodiment so that while the inspection module is inspecting a product, the film frame aligner 10 can align and store the pre-aligned film frame for a quick exchange off of the inspection module.

If a notch detection was not made by the pusher mechanism sensors 124 in step 208, then the method 200 moves from step 208 to step 212, where controller 120 triggers the film frame pusher mechanism 26 to lower. In step 216, controller 120 triggers the film frame location mechanism 30 to lower. In step 220, the film frame on vacuum chuck 40 is rotated. The rotation mechanism 42 rotates the vacuum chuck 40 (and correspondingly the film frame on the vacuum chuck 40), while the rotation mechanism sensors 126 (FIG. 7) assure that the rotation mechanism 42 works properly. In one embodiment, the rotation mechanism sensors 126 are hall effect sensors that ensure that the rotation mechanism 42 does not get hung up, while flow controls keep the rotation mechanism 42 from over acceleration or the like. In one embodiment, the film frame is rotated in step 220 by a set angle, such as 90°. In one form of the invention, a rotary cylinder is activated by controller 120 that causes the vacuum chuck 40 and the film frame to rotate 90°. After performing the rotation in step 220, the method 200 returns to step 204.

Several iterations of step 220 may be performed before the desired orientation is reached. In one embodiment, the rotation mechanism 42 is configured to only rotate 90° at a time, so a robot lifts the film frame up off of the vacuum chuck 40 to allow the rotation mechanism 42 to reset (e.g., rotate in the reverse direction by 90°) after performing a rotation. Thus, rotation mechanism 42 according to one embodiment rotates in a clockwise direction and a counter-clockwise direction.

In one embodiment, after an aligned film frame has been inspected by an inspection module, the film frame is returned to film frame aligner 10 to un-rotate the film frame. This step is only performed in one embodiment if the film frame was rotated by the film frame aligner 10 and then placed in the inspection module.

Accordingly, the invention as described above and understood by one of skill in the art is simplified, provides an effective, safe, inexpensive, and efficient device, system and process which achieves all the enumerated objectives, provides for eliminating difficulties encountered with prior devices, systems and processes, and solves problems and obtains new results in the art.

In the foregoing description, certain terms have been used for brevity, clearness and understanding; but no unnecessary limitations are to be implied therefrom beyond the requirement of the prior art, because such terms are used for descriptive purposes and are intended to be broadly construed.

Moreover, the invention's description and illustration is by way of example, and the invention's scope is not limited to the exact details shown or described.

Having now described the features, discoveries and principles of the invention, the manner in which it is constructed and used, the characteristics of the construction, and the advantageous, new and useful results obtained; the new and useful structures, devices, elements, arrangements, parts and combinations, are set forth in the appended claims.

What is claimed is:

1. A method of automatically aligning a film frame, comprising:
   providing a film frame aligner including a film frame support, a guiding mechanism, and a location mechanism;
   positioning the film frame on the film frame support with a film frame handling device; and
   actuating the guiding mechanism to guide the film frame into contact with the location mechanism, thereby causing the film frame to be appropriately aligned.

2. The method of claim 1, and further comprising:
   sensing whether notches in the film frame have engaged with locating structures of the location mechanism.

3. The method of claim 2, and further comprising:
   rotating the film frame with the film frame support if the notches have not engaged with the locating structures.

4. The method of claim 3, and further comprising:
   monitoring the rotation of the film frame with at least one sensor.

5. The method of claim 1, and further comprising:
   detecting whether a film frame is positioned on the support surface.

6. The method of claim 1, and further comprising:
   monitoring movement of the guiding mechanism with at least one sensor.

7. The method of claim 1, and further comprising:
   triggering the location mechanism to move into an appropriate position to locate notches in the film frame.

8. The method of claim 7, and further comprising:
   monitoring movement of the location mechanism with at least one sensor.

9. The method of claim 1, and further comprising:
   providing a wait station on the film frame aligner; and
   placing the film frame on the wait station with the film frame handling device after the film frame is aligned.

10. The method of claim 9, and further comprising:
    detecting whether a film frame is positioned on the wait station.

11. The method of claim 1, and further comprising:
    providing a selection mechanism on the film frame aligner for selecting a size of a film frame to be aligned.

12. The method of claim 1, and further comprising:
    controlling the film frame aligner via a communications network.

13. The method of claim 1, wherein the film frame aligner includes a controller and a serial port, the method further comprising:
    programming the controller via the serial port.

14. A method of automatically aligning a film frame, comprising:
    providing a film frame aligner including a film frame support, a guiding mechanism, and a location mechanism;
    positioning the film frame on the film frame support with a film frame handling device;
    actuating the guiding mechanism to guide the film frame into contact with the location mechanism, thereby causing the film frame to be appropriately aligned; and
    sensing whether notches in the film frame have engaged with locating structures of the location mechanism.

15. The method of claim 14, and further comprising:
    rotating the film frame with the film frame support if the notches have not engaged with the locating structures.

16. The method of claim 14, and further comprising:
    providing a wait station on the film frame aligner; and
    placing the film frame on the wait station with the film frame handling device after the film frame is aligned.

17. A method of automatically aligning a film frame, comprising:
    providing a film frame aligner including a film frame support, a guiding mechanism, and a location mechanism;
    positioning the film frame on the film frame support with a film frame handling device;

actuating the guiding mechanism to guide the film frame into contact with the location mechanism, thereby causing the film frame to be appropriately aligned; and rotating the film frame with the film frame support if notches in the film frame have not engaged with locating structures of the location mechanism.

18. The method of claim 17, and further comprising:
sensing whether the notches in the film frame have engaged with the locating structures of the location mechanism.

19. The method of claim 17, and further comprising:
providing a wait station on the film frame aligner; and
placing the film frame on the wait station with the film frame handling device after the film frame is aligned.

20. A method of automatically aligning a film frame, comprising:
providing a film frame aligner including a film frame support, a guiding mechanism, and a location mechanism;
positioning the film frame on the film frame support with a film frame handling device;
actuating the guiding mechanism to guide the film frame into contact with the location mechanism, thereby causing the film frame to be appropriately aligned;
providing a wait station on the film frame aligner; and
placing the film frame on the wait station with the film frame handling device after the film frame is aligned.

21. The method of claim 20, and further comprising:
sensing whether notches in the film frame have engaged with locating structures of the location mechanism.

22. The method of claim 21, and further comprising:
rotating the film frame with the film frame support if the notches have not engaged with the locating structures.

23. A method of automatically aligning a film frame, comprising:
providing a film frame aligner including a film frame support, a guiding mechanism, and a location mechanism;
providing a film frame cassette that holds at least one film frame;
removing a film frame from the film frame cassette with a film frame handling device;
positioning the removed film frame on the film frame support with the film frame handling device; and
actuating the guiding mechanism to guide the film frame into contact with the location mechanism, thereby causing the film frame to be appropriately aligned.

24. A method of automatically aligning a film frame, comprising:
providing a film frame aligner including a film frame support, a guiding mechanism, and a location mechanism;
positioning a film frame that holds at least one semiconductor die on the film frame support with a film frame handling device; and
actuating the guiding mechanism to guide the film frame into contact with the location mechanism, thereby causing the film frame to be appropriately aligned.

* * * * *